United States Patent [19]

Gloton et al.

[11] Patent Number: 4,990,759
[45] Date of Patent: Feb. 5, 1991

[54] CHIP CARD STRUCTURE

[75] Inventors: Jean-Pierre Gloton, Aix en Provence; Gérard Coiton, Venelles, both of France

[73] Assignee: Gemplus Card International, Aix en Provence, France

[21] Appl. No.: 285,712

[22] Filed: Dec. 16, 1988

[30] Foreign Application Priority Data

Dec. 22, 1987 [FR] France .................. 87 17902

[51] Int. Cl.$^5$ .................................................. G06K 19/06
[52] U.S. Cl. ................................... 235/492; 235/487; 235/488
[58] Field of Search .................. 235/492, 487, 488; 283/83; 361/398

[56] References Cited

U.S. PATENT DOCUMENTS 4,463,971  8/1984  Yahya ............................ 283/83
4,774,633  2/1988  Dehaine ........................ 361/398

FOREIGN PATENT DOCUMENTS 0246973  11/1987  European Pat. Off. .
2538930   6/1984  France .
2096541  10/1982  United Kingdom .

Primary Examiner—Harold Pitts
Attorney, Agent, or Firm—Roland Plottel

[57] ABSTRACT

Disclosed is a method for the fabrication of chip cards. These cards are flat and undergo a high degree of deformation under bending and twisting stresses, when the user does not take any special precautions in their use. A micromodule is housed in a cavity of the card, and this micromodule is fixed by the natural adhesion between the plastic material of the bottom of the cavity and the coating resin of the integrated circuit of the module. To prevent the micromodule from being torn off during a bending stress undergone by the card, there is provision for at least one overhang by which the upper surface of the card covers an edge of the micromodule to limit the movements of said micromodule.

6 Claims, 2 Drawing Sheets

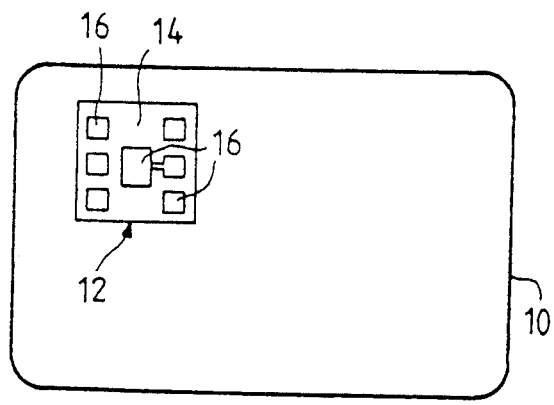
FIG_1
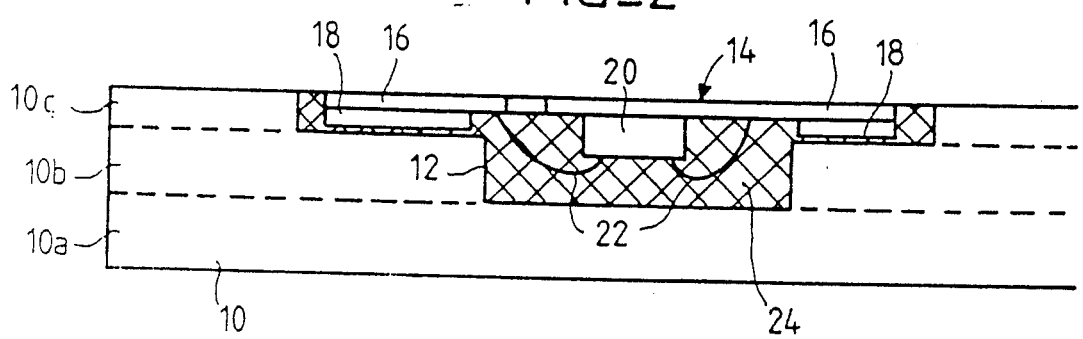
FIG_2
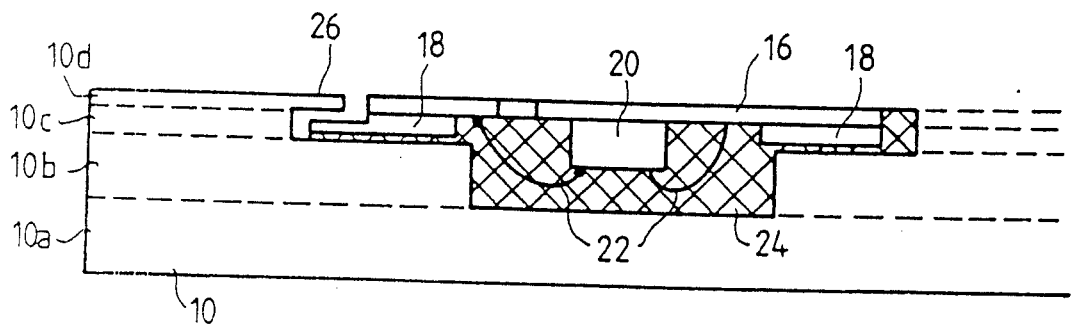
FIG_3

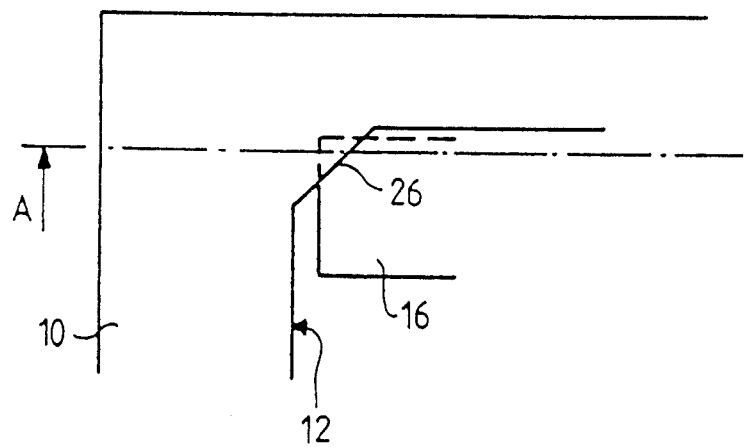
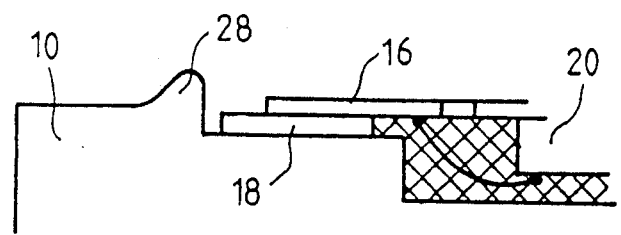
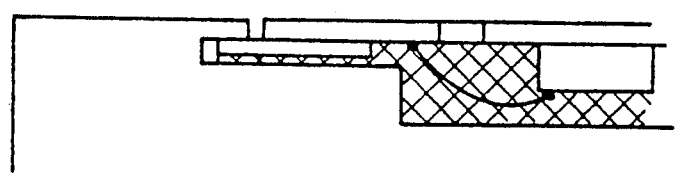

CHIP CARD STRUCTURE

BACKGROUND OF THE INVENTION

1. Field of the Invention

The invention concerns the fabrication of cards containing integrated circuits, more generally known as chip cards, or again the fabrication of cards containing a component.

These cards, which are now widespread in applications such as the pre-payment of telephone calls from public phone booths, are used by the general public and undergo mechanical stresses which are all the more severe as users have to carry these cards with them practically all the time so as to have them at hand when the need arises.

2. Description of the Prior Art

Now, to prevent these cards from being too bulky, they are made to have very flat formats. The ideal credit card format, at present, is one with sides of a few centimeters (about 10 centimeters long and half as wide) with a thickness of about 1 to 2 millimeters.

This small thickness makes these cards flexible. Now, the integrated circuit inside a card of this type is mounted in the form of a micromodule placed in a cavity made in the card, and is joined to the card by a heating operation. During this operation, the thermoplastic bonder coating the integrated circuit in the micromodule gets partially melted and adheres to the plastic material forming the card.

The adhesion of the micromodule to the card is thus essentially due to this heating operation which may also be an operation for bonding the micromodule to the bottom of the cavity. The micromodule is not held in the cavity in any other way because it should not be overlooked that the connection terminals of the chip card are made on the micromodule itself, and that these connections should essentially be flush with the plane of the upper surface of the card. It has been noted that there is a considerable risk of the micromodule being torn off if the card undergoes excessive bending stresses. This tearing off process, even if it is partial, may subsequently prevent the card from being used.

One method to reduce this risk has been adopted in a very general way: it consists in placing the micromodule in a corner and not at the center of the card because the relative deformation undergone by zones of the card, when bent or twisted, is smaller at the edges than at the center of the card.

However, this measure is not sufficient and the invention proposes to improve the fabrication of chip cards to further reduce the risk of the module being torn away when the card is subjected to bending stresses.

SUMMARY OF THE INVENTION

For this purpose, the invention proposes a flat chip card having a cavity provided in the body of the card and a micromodule housed in this cavity, said micromodule comprising an integrated circuit of a given size, connected to a set of bare connection terminals, larger in size than said circuit and flush with the plane of the upper surface of the card when the micromodule is mounted in the cavity; a card wherein the edges of the cavity have at least one overhanging zone or overhang partially covering an edge of the set of connection terminals of the micromodule so as to limit the movement of this micromodule towards the outside of the cavity.

The overhang may occupy a corner of the cavity if it is square or rectangular.

It is preferably placed in that zone of the cavity which undergoes the greatest degree of deformation if the card should be bent.

If necessary, it is possible to envisage an overhang on top of each corner of the cavity.

In many cases the card may be made by the co-lamination of sheets of plastic material (polyvinyl chloride for example), each of these sheets being previously cut out so as to form the cavity by the superimposition of the cut-out parts; In this case, the overhang can also be made by cutting out the upper sheet of the superimposed layers to a particular shape.

It is also possible to consider an approach where the card and its cavity are made by molding by the transfer of a thermoplastic or thermosetting resin. In this case, it is preferably provided that the mold will define a shape with a boss in at least one location on the edge of the cavity. After the micromodule is positioned in the cavity, this boss is flattened, under heat, to form the overhang partially covering an edge of the micromodule to help it to be kept in position

BRIEF DESCRIPTION OF THE DRAWINGS

Other characteristics and advantages of the invention will appear from the following detailed description, made with reference to the appended figures, of which:

FIG. 1 shows the general standard appearance of a chip card with a credit card format;

FIG. 2 shows an enlarged view of the arrangement of an integrated circuit micromodule inside a cavity made in the card;

FIG. 3 shows the card structure according to one embodiment of the invention;

FIG. 4 shows a partial top view corresponding to FIG. 3;

FIG. 5 shows a schematic view of two stages of a method for making an overhang, according to the invention, by the compression of a boss on the card.

DESCRIPTION OF PREFERRED EMBODIMENTS

FIG. 1 shows a chip card 10 with a standard ISO format: it is rectangular, about ten centimeters long, five centimeters wide and 1 to 2 millimeters thick.

In the upper left-hand corner of the card, there is provided a circular, square or rectangular cavity 12. This cavity 12 contains a micromodule that incorporates an integrated circuit and bare connection terminals by which the card can be connected to a reading device (not shown).

The micromodule is designated by the reference 14, and the connection terminals by the reference 16.

In practice, the micromodule is made using a printed circuit comprising conductors which are photo-etched on an insulating substrate. The substrate is cut out in its center to enable the mounting of an integrated circuit chip which will be connected to the various connection terminals of the printed circuit.

FIG. 2 shows an enlarged sectional view of the card 10 with its cavity 12 and the micromodule housed inside the cavity. The card is made of plastic material, for example polyvinyl chloride (PVC) or another thermoplastic or thermosetting material. It may be made by the superimposition of thin sheets, bonded to one another, such as sheets 10a, 10b, 10c in FIG. 2. Each sheet is then cut out beforehand before it is bonded to the others, so that the superimposition of the sheets forms the cavity 12. In FIG. 9, the sheet 10a has not been cut out. The sheet 10b has a cut out portion with dimensions which make it possible to house essentially the integrated circuit chip and the wires that connect it to the connection terminals 16 of the card. Finally, the sheet 10c has a wider cut out portion than the sheet 10b, to house the upper part of the micromodule 1.

The card could also be molded by hot injection molding of resin, under pressure, in a mold with a shape which defines not only the external volume of the card, but also the cavity 12.

The micromodule is made using a printed circuit, namely an insulating substrate 18 (polyimide for example), coated with a photo-etched conducting layer 15 forming the connection terminals 16 which are accessible from outside the card. If that face of the printed circuit which carries the connection conductors is called its front face, then the insulating substrate 18 is located inside the cavity 12 and the connection terminals are flush with the exterior in the plane of the upper surface of the card. The insulating substrate 18 is cut out in its center to leave place for an integrated circuit chip 20 located inside the cavity, beneath the connection conductors 16.

Preferably, the chip is soldered to the rear of one of the connection terminals, for example a terminal forming the electrical ground of the card, and it is connected by connecting wires 22, for example gold or aluminium wires, to the other connection terminal 16.

The chip 20 and the connection wires 22 are coated in a protective resin 24. The resin does not cover the front face of the connection terminals since these terminals have to remain accessible. It is the entire unit comprising the chip 20, the connecting wires 22, the insulating substrate 18, the connection terminals 16 and the coating resin 24 that forms the micromodule 14.

In the prior art, the micromodule is positioned in a cavity which gradually flares out from the bottom upwards, i.e. the dimensions of the cavity increase in going from the bottom of the cavity upwards, hence in going towards the upper face of the card.

The micromoiule is kept in position in the cavity solely by the adhesion of the resin to the bottom of the cavity. This adhesion is obtained by heating the resin, after the module is positioned, or by simple bonding.

According to the invention, there is proposed a structure such as that of FIG. 3, wherein the edges of the cavity have at least one overhang covering a part of the module to restrict its upward movement The overhang is designated by the reference 26. The other references of FIG. 3 designate elements identical to those of FIG. 2. The overhang is made at a place where the module has greater chances of being torn off if the card should undergo bending or twisting stresses. For example, an overhang is provided at two corners of the cavity, said corners being aligned along a direction close to a diagonal of the card. But the overhangs may also be distributed differently, for example each of them may be in the middle of an edge of the cavity.

The overhang can be made in different ways, especially depending on the mode of fabrication of the card. For example, if the card is made by the superimposition of sheets of plastic material, pressed under heat and cut out in such a way that the superimposition of the sheets forms the cavity, it can be provided that the upper sheet of the stack will have a cut-out portion such that the superimposition of the last but one sheet and the last sheet forms an overhang of the last sheet on top of the cut-out portion of the last but one sheet. FIG. 3 shows a stack of four sheets 10a, 10b, 10c, 10d. The last but one sheet is therefore the sheet 10c, and the last sheet is the sheet 10d provided with the overhang 26.

Since it is particularly desirable for the front face of the connection terminals 16 to be exactly in the plane of the upper face of the card 10, it has been provided that the overhang 26 will cover the insulating support at a place where this support is not covered by the metal of the connection terminals. This makes it possible to prevent the overhang from going beyond the height of the front face of the connection terminals provided, however, that the thickness of the plastic in the overhanging zone does not exceed the thickness of the layer of connection conductors 16. The insulating substrate 18 could also be designed to be non-plane but to have a set-back towards the bottom, enabling it to slide under the overhang 26 while, at the same time, leaving the overhang and the connection terminals in the same plane as the upper face of the card.

Purely by way of example, FIG. 4 represents a top view of the card showing a possible arrangement of the overhanging element 26 in a corner of the cavity 12.

Another embodiment of the overhang can be used very particularly in the case of cards made by molding. This embodiment is shown schematically in FIG. 5. It consists in making the mold, which gives its shape to the card 10, have a shape capable of defining:

firstly, the general volume of the card (flat credit card format);

secondly, the cavity 12 to house the micromodule 14;

and thirdly, at least one boss 28 on one edge of the cavity, said boss extending upwards and not towards the inside of the cavity.

After the micromodule is inserted into the cavity, the boss is compressed under heat until it is brought into the plane of the upper face of the card. Thus, the overhang 26 is formed at the same time as the micromodule coating resin adheres, under the effect of the heat, to the plastic material at the bottom of the cavity 12.

It is also possible to use an ultrasonic technic to push down overhangs against the micromodule edges.

In embodiments wherein the card does not have electrical contacts (electromagnetic or optical transmission between the card and the card reading apparatus) the pushed-down overhangs may cover a large portion or even the whole surface of the micromodule.

The material forming the overhangs may be slightly conductive (for instance it is loaded with metallic fibers) so that it will have antistatic properties: damaging electrostatic charges will be removed by this slight conductivity.

Finally, in some cases, it will be desirable to give the overhangs a form allowing elastic removal and reinsertion of the micromodule in the cavity (clipping effect).

What is claimed is:

1. A flat chip card having a cavity provided in the body of the card and a micromodule housed in this cavity, said micromodule comprising an integrated circuit of a given size, connected to a set of bare connection terminals, larger in size than said circuit and flush with the plane of the upper surface of the card when the micromodule is mounted in the cavity; a card wherein the edges of the cavity have at least one overhanging zone or overhang partially covering an edge of the set of connection terminals of the micromodule so as to limit the movement of this micromodule towards the outside of the cavity.

2. A chip card according to claim 1, wherein the overhang is arranged in a corner of the cavity, said cavity being a rectangular or square shaped.

3. A chip card according to either of the claims 1 or 2, wherein the card is made by the pressing of superimposed sheets of plastic material, some of the sheets being cut out to form the cavity 12, and the last sheet of the superimposition having a cut-out portion of a particular shape defining the desired overhang with respect to the cut-out portion of the preceding sheet.

4. A chip card according to either of the claims 1 or 2, made by resin injection molding, wherein the molding defines the cavity and a boss towards the top of the cavity, on an edge of said cavity, and wherein the boss is compressed on top of an edge of the micromodule after said micromodule has been positioned in the cavity.

5. A chip-carrying card according to claim 1, wherein the overhang is made of a slightly conducting material.

6. A chip-carrying card according to claim 1, wherein said overhang has a form allowing elastic removal and reinsertion of the micromodule in the cavity.

* * * * *